United States Patent
Qian et al.

(10) Patent No.: US 11,798,644 B2
(45) Date of Patent: Oct. 24, 2023

(54) HIERARCHICAL ROM ENCODER SYSTEM FOR PERFORMING ADDRESS FAULT DETECTION IN A MEMORY SYSTEM

(71) Applicant: Silicon Storage Technology, Inc., San Jose, CA (US)

(72) Inventors: Xiaozhou Qian, Shanghai (CN); Yaohua Zhu, Shanghai (CN)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 72 days.

(21) Appl. No.: 17/669,793

(22) Filed: Feb. 11, 2022

(65) Prior Publication Data
US 2023/0170035 A1    Jun. 1, 2023

(30) Foreign Application Priority Data
Nov. 30, 2021  (CN) .......................... 202111444122.6

(51) Int. Cl.
*G11C 7/00* (2006.01)
*G11C 29/04* (2006.01)
*G11C 8/10* (2006.01)

(52) U.S. Cl.
CPC ............... *G11C 29/04* (2013.01); *G11C 8/10* (2013.01)

(58) Field of Classification Search
CPC ...................................................... G11C 29/04
USPC .......................................................... 365/200
See application file for complete search history.

(56) References Cited

U.S. PATENT DOCUMENTS

| 11,568,908 | B2 * | 1/2023 | Nagata ..................... G11C 8/08 |
| 2015/0243368 | A1 | 8/2015 | Remington |
| 2020/0243153 | A1 | 7/2020 | Kumar |

OTHER PUBLICATIONS

PCT Search Report and Written Opinion dated Jul. 25, 2022 corresponding to the related PCT Patent Application No. PCT/US2022/017434.

* cited by examiner

*Primary Examiner* — Hoai V Ho
(74) *Attorney, Agent, or Firm* — DLA PIPER LLP US

(57) ABSTRACT

Various embodiments are disclosed for performing address fault detection in a memory system using a hierarchical ROM encoding system. In one embodiment, a hierarchical ROM encoding system comprises two levels of ROM encoders that are used to detect an address fault. In another embodiment, a hierarchical ROM encoding system comprises three levels of ROM encoders that are used to detect an address fault.

22 Claims, 12 Drawing Sheets

US 11,798,644 B2

HIERARCHICAL ROM ENCODER SYSTEM FOR PERFORMING ADDRESS FAULT DETECTION IN A MEMORY SYSTEM

PRIORITY CLAIM

This application claims priority to Chinese Patent Application No. 202111444122.6, filed on Nov. 30, 2021, and titled, "Hierarchical ROM Encoder System for Performing Address Fault Detection in a Memory System."

TECHNICAL FIELD

Various embodiments are disclosed for performing address fault detection in a memory system using a hierarchical ROM encoding system.

BACKGROUND OF THE INVENTION

Memory systems are prevalent in modern electronic devices. It is important that memory systems operate in an accurate and reliable manner when data is stored or retrieved.

FIG. 1 depicts exemplary prior art memory system 100. Array 101 comprises a plurality of memory cells arranged in rows and columns. Each row is coupled to one of a plurality of word lines 106, and each column is coupled to one of a plurality of bit lines 107. Array 101 is accessed by row decoder 102, which selects a word line and thereby selects a row, and column decoder 103, which selects a bit line and thereby selects a column. The memory cells can be volatile memory cells (such as DRAM or SRAM cells) or non-volatile memory cells (such as flash memory cells).

In this example, row decoder 102 and column decoder 103 each receive Address A, which is the address in array 101 that is selected for a read or write (program) operation. Address A comprises row address component 104 and column address component 105. For example, if Address A comprises 8 bits [b0:b7], row address component 104 might comprise the first four bits [b0:b3] and column address component 105 might comprises the last four bits [b4:b7], or vice-versa. In the alternative, row address component 104 and column address component 105 might be derived from Address A using a decoding algorithm.

Row decoder 102 receives and decodes row address component 104, which results in one of a plurality of word lines 106 being asserted by row decoder 102. If row address component 104 is m bits, then there will be $2^m$ word lines 106.

Column decoder 103 receives and decodes column address component 105. During a read operation, column decoder 103 also receives signals from all bit lines 107 in array 101. Column decoder 103 decodes bit lines 107 using the column address component 105 to select a particular column, and the value sensed from that column is provided as Output. During a write (program) operation, column decoder 103 receives Input and applies it to a bit line selected by the decoding action in response to the column address component. If column address component 105 is n bits, then there will be $2^n$ bit lines 107. In some examples column decoding is accomplished by multiplexing.

In this manner, row address component 104 and column address component 105 select a particular memory cell for a read or write (program) operation.

Due to imperfections in material or random environmental disturbances, an address fault might occur during a read or write (program) operation. Specifically, the types of address faults that might occur include:
 The row and/or column that is actually selected correspond to a different address than address A;
 No row and/or column is actually selected when one was intended to be selected; or
 More than one row and/or more than one column are actually selected when only one was intended to be selected.

For example, if address A corresponds to word line 0001, an address fault might cause word line 0011 to be selected instead (due to a bit flip of the second bit). Similarly, if address A corresponds to bit line 1100, an address fault might cause two bit lines, such as bit lines 1100 and 1110 to be selected instead. A person of ordinary skill in the art will appreciate that if an address fault is not detected or corrected, an erroneous read or write/program operation will occur.

FIG. 2 depicts a prior art solution to the address fault problem. Memory system 200 comprises the same components as memory system 100 in FIG. 1, as well as ROM row encoder 201, ROM column encoder 202, and comparator 203. ROM row encoder 201 comprises one row of ROM cells for each row in array 101, and ROM column encoder 202 comprises one row of ROM cells for each column in array 101. The purpose of ROM row encoder 201 and ROM column encoder 202 is to provide additional data that can be used to identify address faults.

ROM row encoder 201 receives all of word lines 106 in FIG. 1, i.e., the decoded row address component 104, each word line corresponding to a row in ROM row encoder 201, and when a particular row is selected in array 101, a corresponding row is selected in ROM row encoder 201, and data 205 is output to comparator 203.

ROM column encoder 202 receives decoded column signals from column decoder 103 that can identify a selected column, and when a particular column is selected in array 101, a corresponding row is selected in ROM column encoder 202, and data 206 is output to comparator 203.

In this design, ROM row encoder 201 has been programmed to output a value that includes the row address component associated with the selected row, and ROM column encoder 202 has been programmed to output a value that includes the column address component associated with the selected column. For example, in a situation where no address fault has occurred, if row address component 104 is "0010", then ROM row encoder 201 will have a corresponding output that includes the bits "0010" in output 205, and if column address component 105 is "1111," then ROM column encoder 202 will have a corresponding output that includes the bits "1111" in output 206.

One drawback of the prior art design is that ROM row encoder 201 and ROM column encoder 202 require significant die space. FIG. 3 depicts prior art ROM encoder 300, which can be used for ROM encoder row 201 or ROM column encoder 202. For simplicity, in this example, ROM encoder 300 contains four rows corresponding to word lines [WL0:WL3] in array 101, which in turn correspond to address bits [A1:A0]. A person of ordinary skill in the art that ROM encoder 300 can comprise a much larger number of rows and columns.

By design, instead of encoding address bits [A1:A0] in only two bit lines, ROM encoder 300 also includes complementary bits for those address bits. In this example, the bits [B1:B0] contain the bits corresponding to address bits [A1:A0] and therefore can be compared directly against address bits [A1:A0] by comparator 203. Bit B3 is the complement of bit B1, and bit B2 is the complement of bit B0. Storing complementary bits in addition to the address bits themselves enables the system to robustly identify any address fault that occurs. In the particular configuration shown in FIG. 3, the corresponding asserted word line and output for each address bit [A1, A0] combination will be:

TABLE 1

Input-Output for ROM Encoder 300

| A1 | A0 | Asserted Word Line | B3 | B2 | B1 | B0 |
|---|---|---|---|---|---|---|
| None | None | None | 1 | 1 | 1 | 1 |
| 0 | 0 | WL0 | 1 | 1 | 0 | 0 |
| 0 | 1 | WL1 | 1 | 0 | 0 | 1 |
| 1 | 0 | WL2 | 0 | 1 | 1 | 0 |
| 1 | 1 | WL3 | 0 | 0 | 1 | 1 |

With reference again to FIG. 2, applying the example of Table 1, comparator 203 compares bits B1 and B0 from output 205 with row address component 104, specifically bits A1 and A0. Comparator 203 also compares bits B3 and B2 from output 205 with the inverse of bits B1 and B0. Similar comparisons are done with the output 206 of ROM column encoder 202 and column address component 105. If all four comparisons match, then there has been no address fault, and flag 204 has a value indicating no address fault (e.g., "0"). If one or more of the four comparisons do not match, then there has been an address fault, and flag 204 has a value indicating an address fault (e.g., "1").

Table 2 contains examples of the detection of address fault using the output of ROM encoder 300 based on the input of address bits [0, 0].

TABLE 2

Row Address Fault Detection Using ROM Encoder 300

| Input Row Address | Desired Word Line | Actual Word Line Asserted | Output of ROM Encoder 302 | Detection Result |
|---|---|---|---|---|
| 00 | WL0 | WL0 | 1100 | No address fault |
| 00 | WL0 | WL1 | 1001 | Address Fault: Wrong WL Selected |
| 00 | WL0 | WL0 and WL1 | 1000 | Address Fault: Two WLs Selected |
| 00 | WL0 | None | 1111 | Address Fault: No WL Selected |

As can be seen, 8 switches are required in this design to encode data for two address bits [A1, A0]. More generally, the number of switches required in ROM encoder 300 is equal to: (number of possible word lines)×(number of bits in address), which in this example is 4×2=8. Here, each switch is implemented with an NMOS or PMOS transistor. These switches utilize a significant amount of die space.

What is needed is an improved address fault detection system that can detect address faults while utilizing fewer components and less die space than prior art designs.

SUMMARY OF THE INVENTION

Various embodiments are disclosed for performing address fault detection in a memory system using a hierarchical ROM encoding system. In one embodiment, a hierarchical ROM encoding system comprises two levels of ROM encoders that are used to detect an address fault. In another embodiment, a hierarchical ROM encoding system comprises three levels of ROM encoders that are used to detect an address fault.

DETAILED DESCRIPTION OF THE PREFERRED EMBODIMENT

Figure 4A:
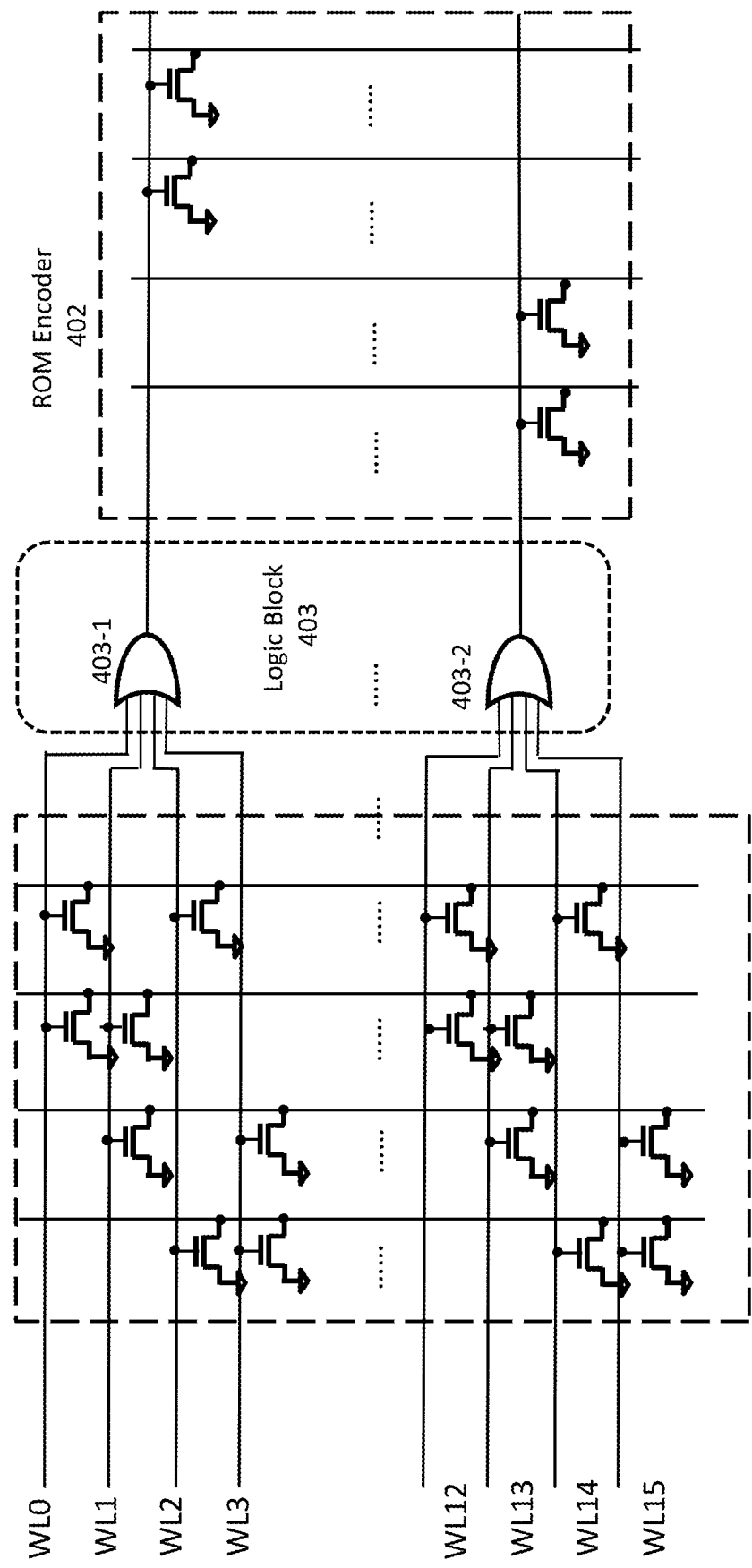
FIG. 4A depicts an embodiment of a hierarchical ROM encoder system.

FIG. 4A depicts hierarchical ROM encoder system 411. ROM encoder system 411 comprises a two-level hierarchy of ROM encoders, specifically, ROM encoder 401 and ROM encoder 402. ROM encoder system 411 further comprises logic block 403 comprising a set of OR gates. In this example, ROM encoder system 411 contains 16 word lines corresponding to a 4-bit row or column address [A3:A0]. A person of ordinary skill in the art will appreciate that ROM encoder system 411 can be constructed with a greater number of word lines corresponding to a greater number of bits in a row or column address, or lesser number of word lines corresponding to a lesser number of bits in a row or column address.

Figure 1:
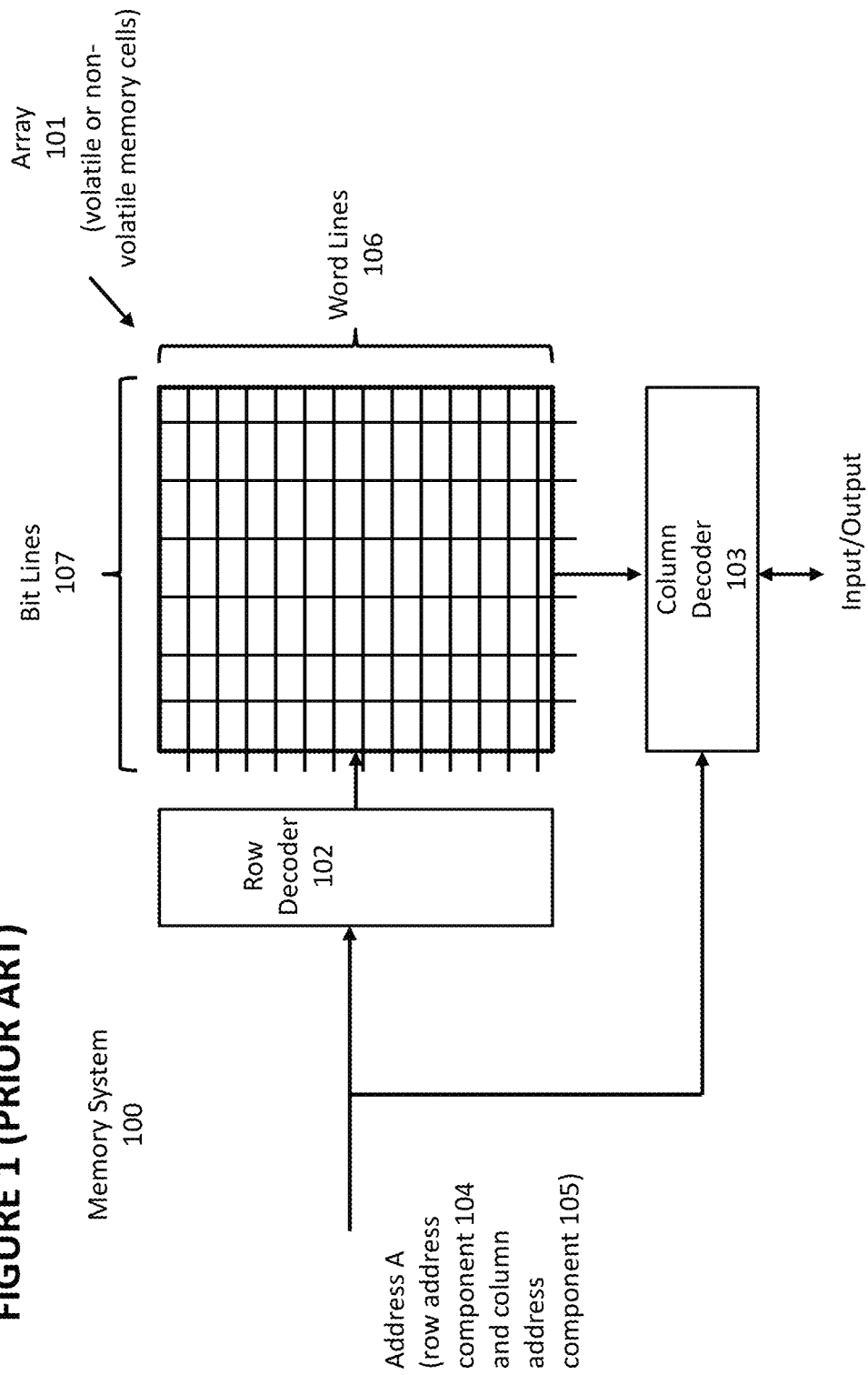
FIG. 1 depicts a prior art memory system.
Figure 2:
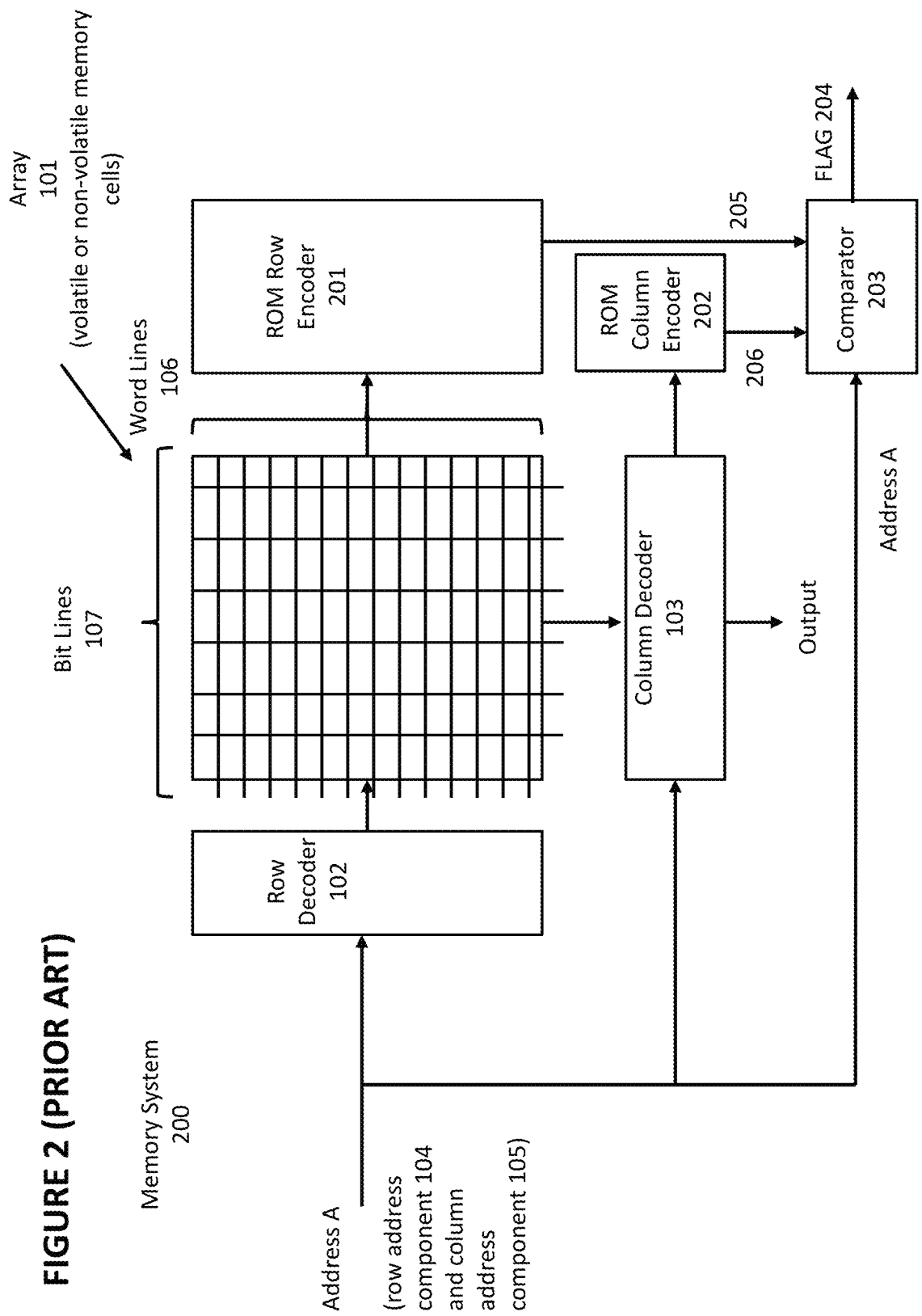
FIG. 2 depicts a prior art memory system with an address fault detection system.

Each row in ROM encoder 401 corresponds to one of the word lines 106 in array 101 in FIG. 1, here shown as word lines [WL0:WL15]. Logic block 403 receives word lines 106 as well. Logic block 403 comprises individual OR gates, such as OR gate 403-1 and OR gate 403-2. In this example, each OR gate receives four word lines and performs an "OR" function on those four word lines. Instead of 4-input OR gates, logic block 403 instead could utilize OR gates of other numbers of inputs. The output of each OR gate (a logic block output) is coupled to a respective row in ROM encoder 402. Thus, whereas the inputs to ROM encoder 401 are 16 word lines [WL0:WL15], the inputs to ROM encoder 402 are 4 lines containing the result of the OR operations (WL0 or WL1 or WL2 or WL3), (WL4, WL5, WL6, or WL7), (WL8, WL9, WL10, or WL11), and (WL12, WL13, WL14, and WL15).

Figure 3:
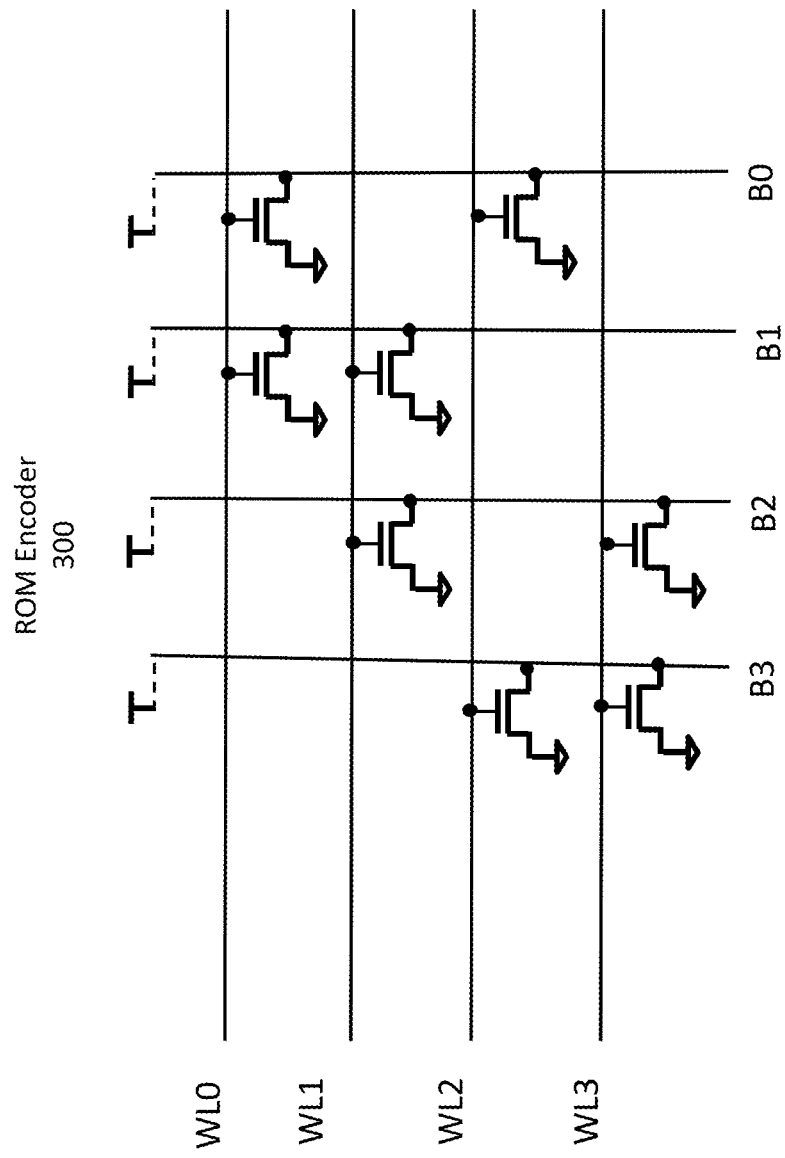
FIG. 3 depicts a prior art ROM encoder.

In this example, ROM Encoder 401 receives all 16 wordlines (WL0 to WL15) and stores the same bit pattern every 4 rows, which correspond to the least 2 significant bits, [A1:A0] in the address, using the same bit pattern shown in FIG. 3. For instance, the bit pattern stored in WL0 to WL3 are identical to the bit pattern stored in WL4 to WL7. This is because each 4-row grouping stores values associated with the 2 least significant bits of the address.

ROM encoder 402 stores the encoding for the 2 most significant bits, [A3:A2]. Those 2 bits essentially indicate which of the 4-word line groupings has been selected. output of the respective OR gates 403-1, 403-2, without limitation, of logic block 403, are a decoding for the 2 most significant bits (A[3:2] in this example). That is, the four signals received by ROM encoder 402 represents the four possible combinations for A[3:2]. For example, if A3=0 and A2=0, then one of word lines WL0, WL1, WL2, and WL3 will be selected, and the output of OR gate 403-1 will be "1", which will assert the row in ROM encoder 402 attached to the output of OR gate 403-1, and so forth.

Hierarchical ROM encoder system 411 also comprises logic (not shown, but shown in subsequent figures) that is used to compare the outputs of ROM encoder 401 and ROM encoder 402 with the address, A, where the output of ROM encoder 401 contains the two least significant bits of the address and their complements, and the output of ROM encoder 402 reflects the two most significant bits of the address and their complements. The logic also compares the stored complements with the inverse of the stored address portions.

Figure 4B:
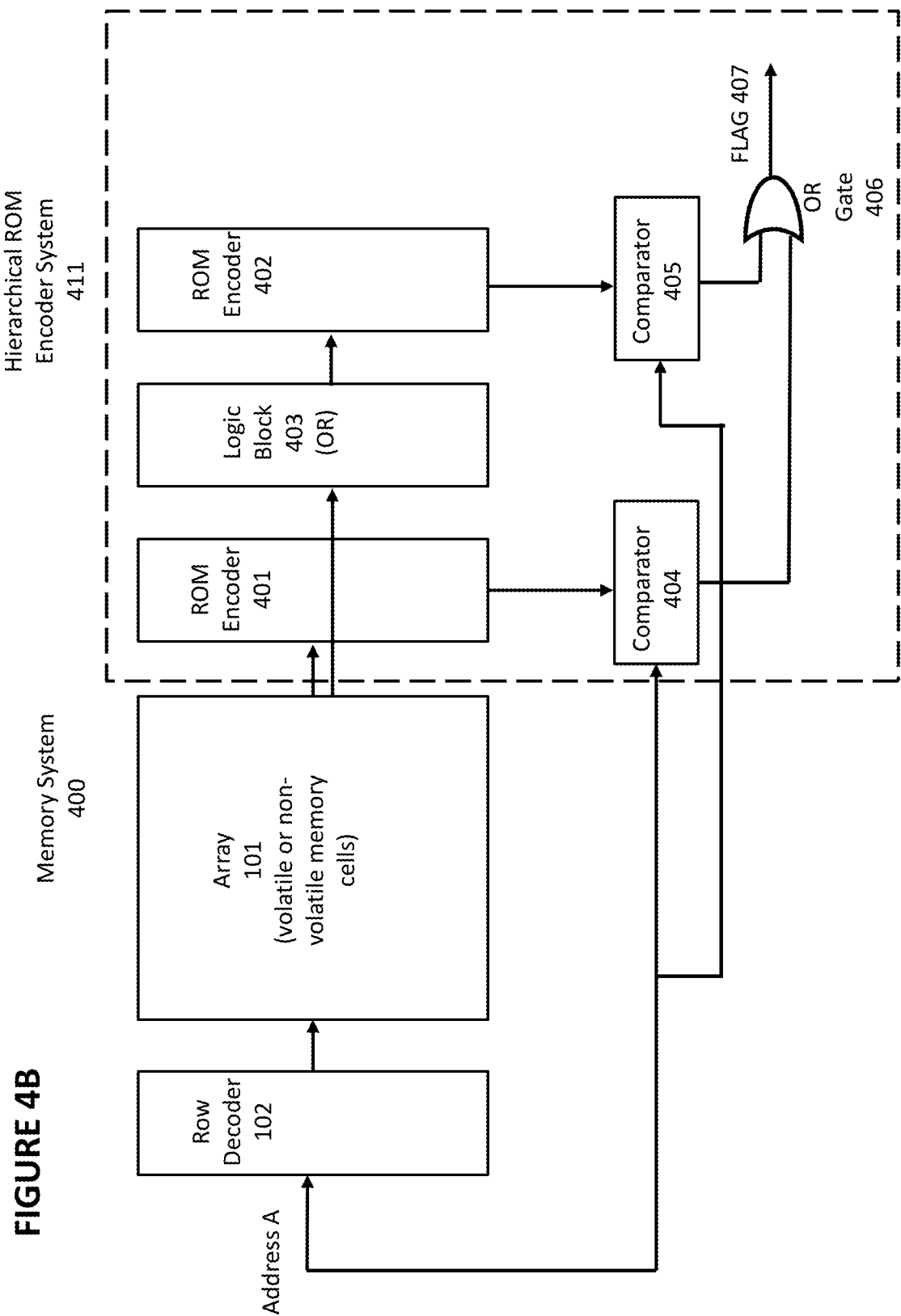
FIGS. 4B and 4C depict an embodiment of a memory system with an improved address fault detection system utilizing the hierarchical ROM encoder system of FIG. 4A.
Figure 4C:
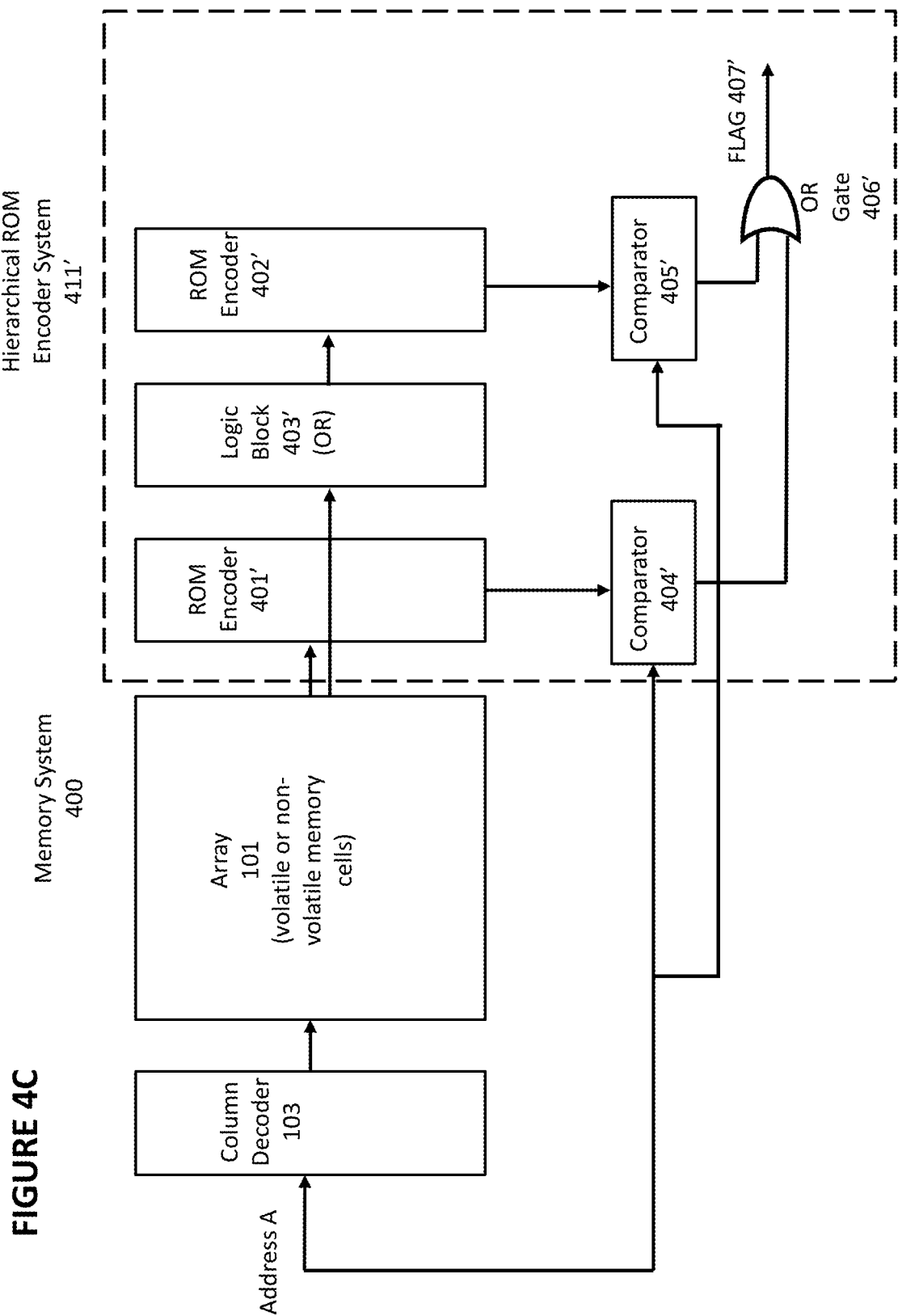

FIGS. 4B and 4C depict the use of hierarchical ROM encoder system 411 in a larger memory system.

In FIG. 4B, memory system 400 comprises array 101, row decoder 102, and hierarchical ROM encoder system 411, which here is shown as further comprising comparator 404, comparator 405, OR gate 406, and flag 407 (which is a row address fault detection signal).

During operation, ROM encoder 401 outputs a first output in response to its asserted row or rows, and ROM encoder 402 outputs a second output in response to its asserted row or rows in response to the signals receives from logic block 403. Comparator 404 compares the first output against a first portion of row address component 104, and comparator 405 compares the second output against a second portion of row address component 104. In one example, comparator 404 also compares the complement portion of the first output against the inverse of the address portion of the first output, and comparator 405 also compares the complement portion of the second output against the inverse of the address portion of the second output. The results of comparator 404 and 405 undergo an OR function by OR gate 406 to generate flag 407. A first value of flag 407 (e.g., "1") indicates a row address fault, and a second value (e.g., "0") indicates no row address fault.

FIG. 4C depicts the same mechanism described in FIG. 4B but for the column decoder 103 instead of row decoder 102. Memory system 400 comprises array 101 and further comprises column decoder 103 and hierarchical ROM encoder system 411', which here is shown as further comprising comparator 404', comparator 405', OR gate 406', and flag 407' (which is a column address fault detection signal).

During operation, ROM encoder 401' outputs a first output in response to its asserted row or rows, and ROM encoder 402' outputs a second output in response to its asserted row or rows in response to the signals receives from logic block 403'. Comparator 404' compares the first output against a first portion of column address component 105, and comparator 405' compares the second output against a second portion of column address component 104'. In one example comparator 404' also compares the complement portion of the first output against the inverse of the address portion of the first output, and comparator 405' also compares the complement portion of the second output against the inverse of the address portion of the second output. The results of comparator 404' and 405' undergo an OR function by OR gate 406' to generate flag 407'. A first value of flag 407' (e.g., "1") indicates a column address fault, and a second value (e.g., "0") indicates no column address fault.

In the example of FIG. 4B or FIG. 4C, ROM encoders 401 and 401' each requires 32 switches, ROM encoders 402 and 402' each requires 8 switches, and logic blocks 403 and 403' each requires 28 switches to create the four OR gates, for a total of 68 switches in each of FIGS. 4B and 4C. The same implementation using a single ROM encoder requires 64 switches for detecting row address faults and 64 switches for detecting column address faults, so for an example of 16 rows, there is not yet any savings in die space. However, for 32 rows, hierarchical ROM encoder systems 411 and 411' each requires 144 switches compared to 160 switches for each of two ROM encoders 300, which is a savings in die space. The savings increases as the number of rows increases thereafter, as shown below in Table 3.

An example of how the output of ROM encoders 401 and 402 detects an address fault is illustrated in Table 2:

TABLE 2

Input-Output for Hierarchical ROM Encoder System 411

| Input Address | Desired WL<15:0> | Actual WL<15:0> Asserted | Output of ROM Encoder 401 | Output of ROM Encoder 402 | Detection Result |
|---|---|---|---|---|---|
| 0 | 0000 . . . 0001 | 0000 . . . 0001 | 1100 | 1100 | No address fault |
| 0 | 0000 . . . 0001 | 0000 . . . 1000 | 0011 | 1100 | Address Fault: Wrong WL Selected |
| 0 | 0000 . . . 0001 | 0001 . . . 0000 | 1100 | 0011 | Address Fault: Wrong WL Selected |
| 0 | 0000 . . . 0001 | 0000 . . . 0000 | 1111 | 1111 | Address Fault: No WL Selected |
| 1 | 0000 . . . 0010 | 0000 . . . 0010 | 0110 | 1100 | No address fault |
| 2 | 0000 . . . 0100 | 0000 . . . 1100 | 0111 | 1100 | Address Fault: Wrong WL Selected |
| 3 | 0000 . . . 1000 | 1000 . . . 1000 | 0011 | 0000 | Address Fault: Multiple WL Selected |

Figure 5A:
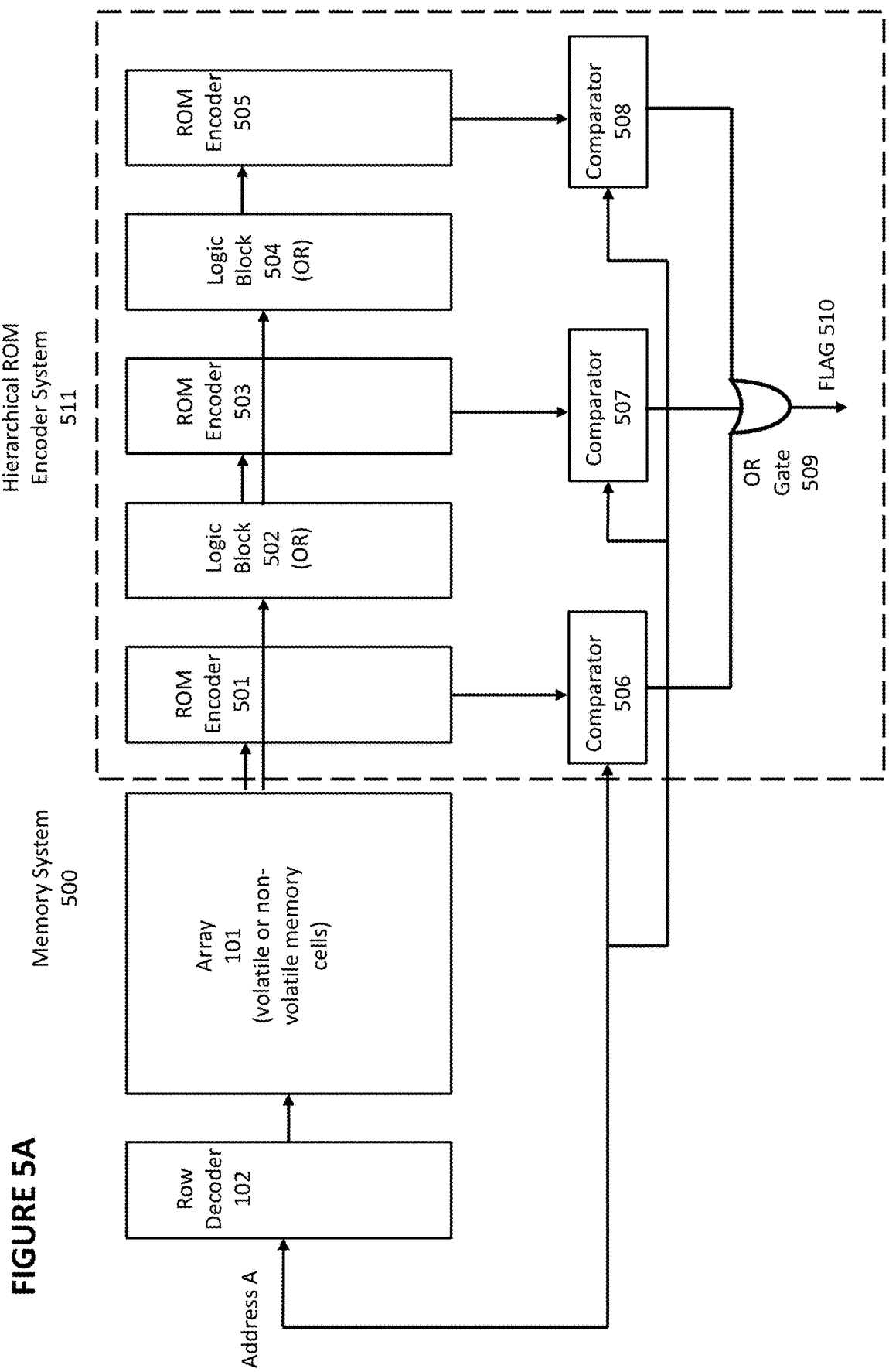
FIGS. 5A and 5B depict another embodiment of a memory system with an improved address fault detection system.
Figure 5B:
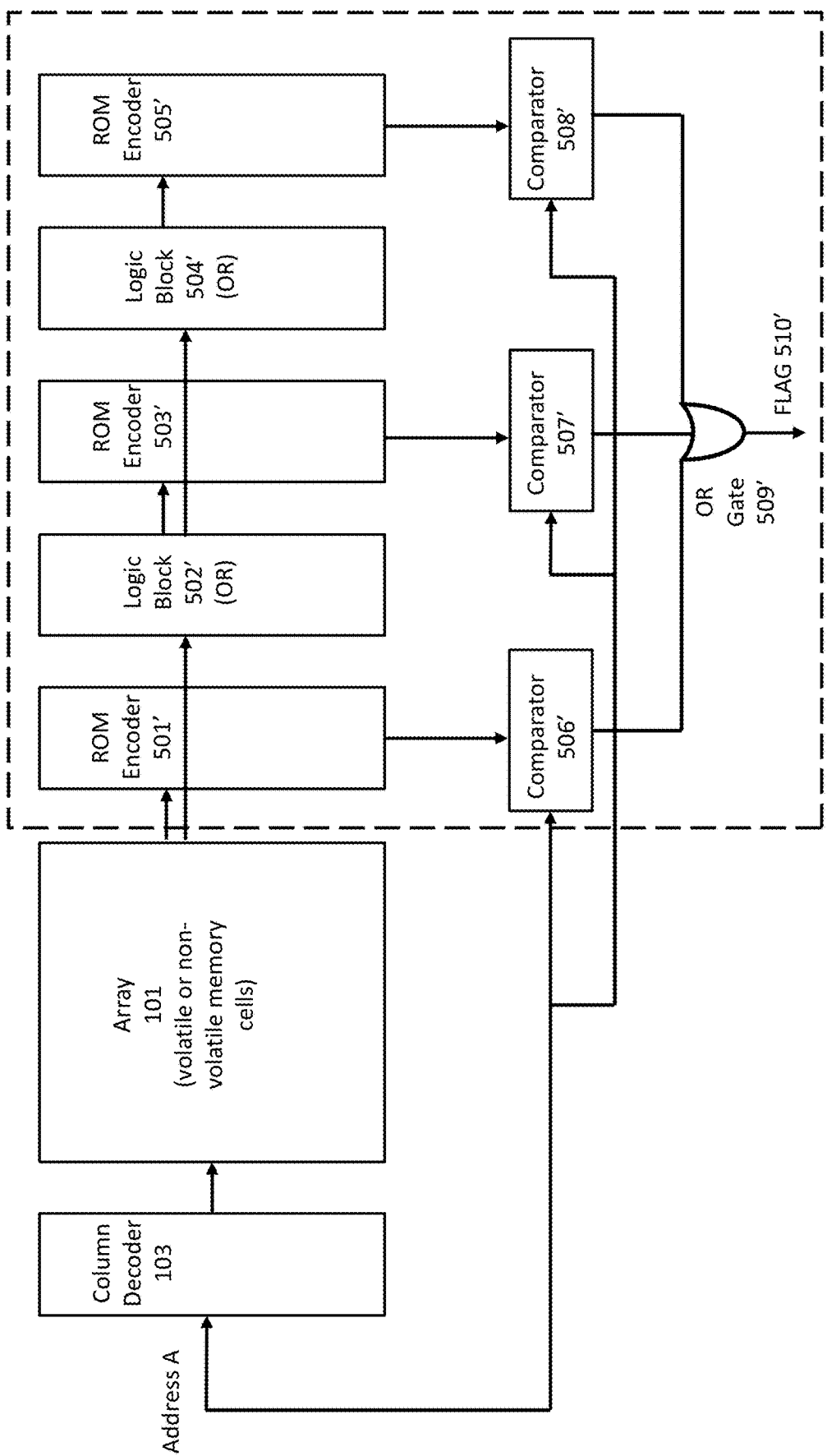

FIGS. 5A and 5B depict memory system 500.

In FIG. 5A, memory system 500 comprises array 101, hierarchical ROM encoder system 511, and row decoder 102. Hierarchical ROM Encoder System 511 comprises a three-level hierarchy of ROM encoders, specifically, ROM encoder 501, ROM encoder 503, and ROM encoder 505. Hierarchical ROM encoder system 511 further comprises logic block 502 (comprising OR gates), logic block 504

(comprising OR gates), comparator 506, comparator 507, comparator 508, OR gate 509, and flag 510.

In FIG. 5B, memory system 500 comprises array 101 and further comprises hierarchical ROM encoder system 511', and column decoder 103. Hierarchical ROM Encoder System 511' comprises a three-level hierarchy of ROM encoders, specifically, ROM encoder 501', ROM encoder 503', and ROM encoder 505'. Hierarchical ROM encoder system 511' further comprises logic block 502' (comprising OR gates), logic block 504' (comprising OR gates), comparator 506', comparator 507', comparator 508', OR gate 509', and flag 510'.

Hierarchical ROM encoder systems 511 and 511' operate in the same way as hierarchical ROM encoder systems 411 and 411', respectively, except that a third level is added. Logic blocks 504 and 504' receive a multi-bit output from ROM encoder 503 and 503', respectively, and perform an OR operation on sets of four bits to generate a logic block output, which then serves as the input to ROM encoder 505 and 505', respectively, which generates a third output in response to its input. Thus, ROM encoders 503 and 503' contain one-fourth the number of inputs and rows as ROM encoders 501 and 501', respectively, and ROM encoders 505 and 505' contain one-fourth the number of inputs and rows as ROM encoders 503 and 503', respectively.

During operation, ROM encoders 501 and 501', respectively, output a first output in response to its asserted row or rows, ROM encoders 502 and 502', respectively, output a second output in response to its asserted row or rows, and ROM encoders 503 and 503' output a third output in response to its asserted row or rows. Comparators 506 and 506' compare the first output against a first portion of row address component 104 and column address component 105, respectively, comparators 507 and 507' compare the second output against a second portion of row address component 104 and column address component 105, respectively, and comparators 508 and 508' compare the third output against a third portion of row address component 104 and column address component 105, respectively. The results of comparators 506, 507, and 508 undergo an OR function by OR gate 509 to generate flag 510, which is a row address fault detection signal, and the results of comparators 506', 507', and 508' undergo an OR function by OR gate 509' to generate flag 510', which is a column address fault detection signal. A first value of flag 510' (e.g., "1") indicates an address fault, and a second value (e.g., "0") indicates no address fault.

Figure 6A:
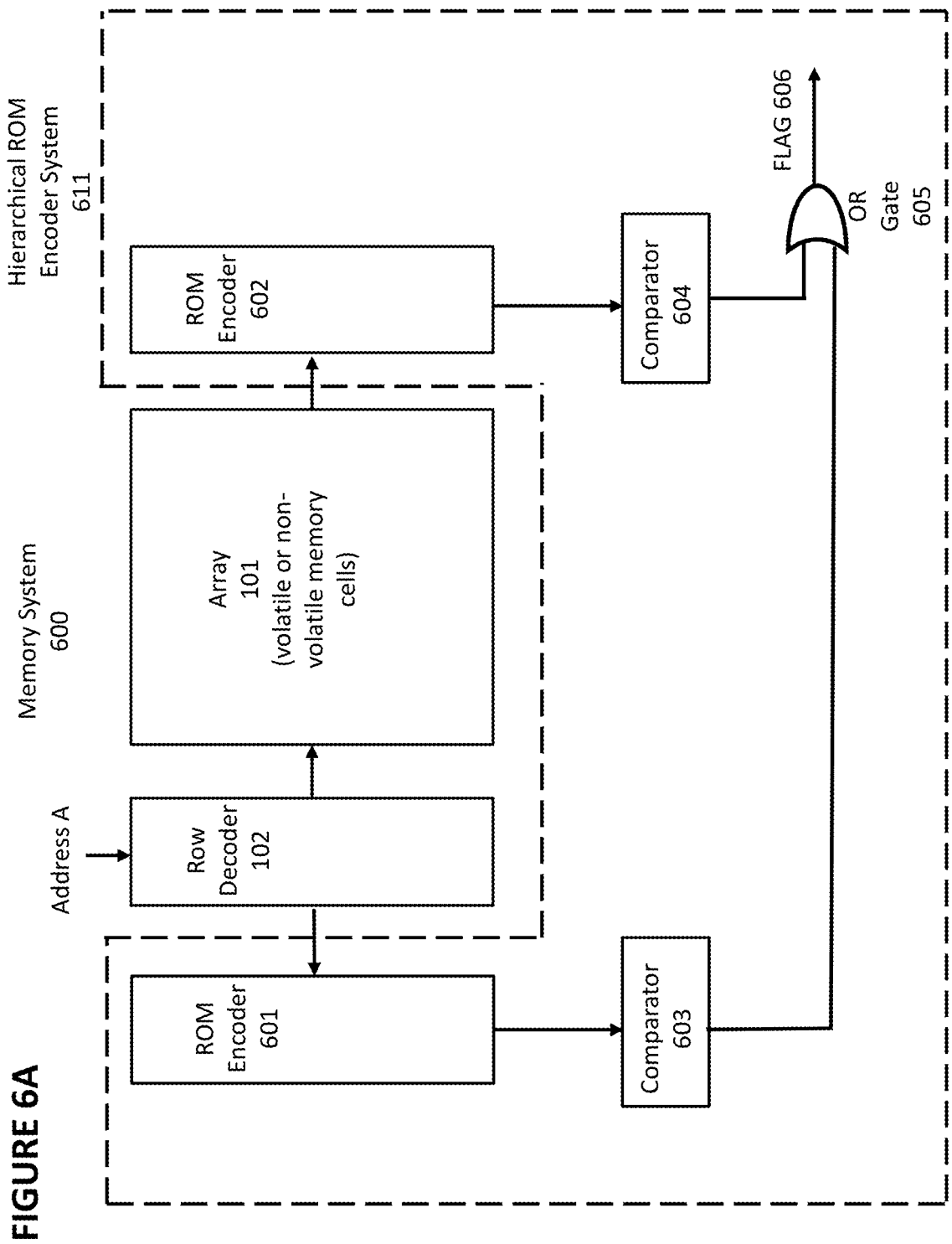
FIGS. 6A and 6B depict another embodiment of a memory system with an improved address fault detection system.
Figure 6B:
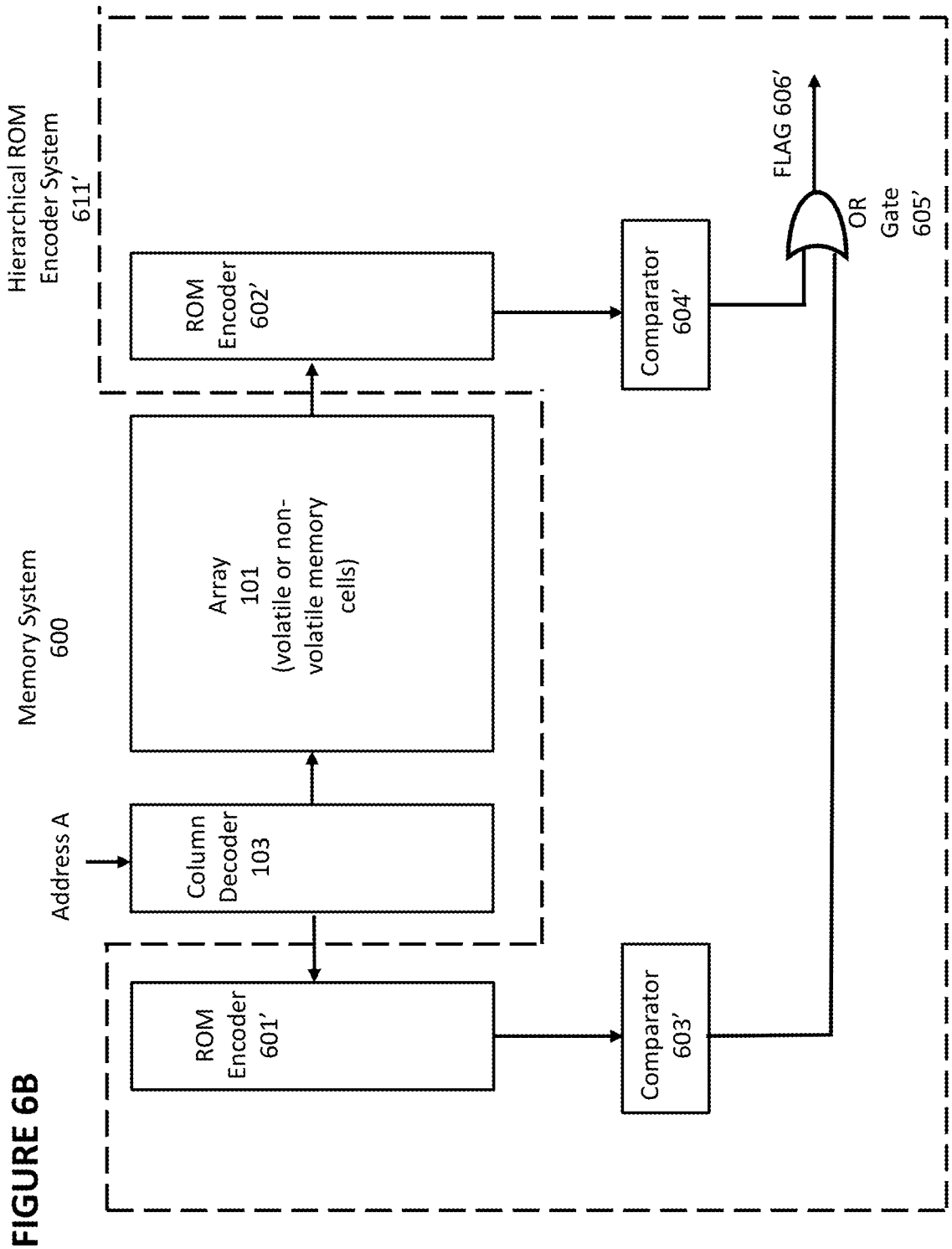

FIGS. 6A and 6B depict memory system 600. In FIG. 6A, memory system 600 comprises array 101, hierarchical ROM encoder system 611, and row decoder 102. In FIG. 6B, memory system 600 comprises array 101 and further comprises hierarchical ROM encoder system 611' and column decoder 103. Hierarchical ROM encoder system 611 comprises a two-level hierarchy of ROM encoders, specifically, ROM encoder 601 and ROM encoder 602, and hierarchical encoder system 611' comprises a two-level hierarchy of ROM encoders, specifically, ROM encoder 601' and ROM encoder 602'. Hierarchical ROM encoder system 611 further comprises comparator 603, comparator 604, OR gate 605, and flag 606, and hierarchical ROM encoder system 611' further comprises comparator 603', comparator 604', OR gate 605', and flag 606'. Notably, unlike hierarchical ROM encoder system 511 and 511', a separate logic block is not required between the two ROM encoders. This is because ROM encoder 601 instead receives its inputs from row decoder 102 and ROM encoder 601' receives its inputs from column decoder 103, which performs a separate encoding function to replace the OR gates of logic block 403 in memory system 400 or logic blocks 502 and/or 504 in memory system 500.

With reference to FIG. 6A, during operation, ROM encoder 601 outputs a first output in response to its asserted row or rows, and ROM encoder 602 outputs a second output in response to its asserted row or rows. Comparator 603 compares the first output against a first portion of row address component 104 (or column address component 105), and comparator 604 compares the second output against a second portion of row address component 104 (or column address component 105). The results of comparator 603 and 604 undergo an OR function by OR gate 605 to generate flag 606. A first value of flag 606 (e.g., "1") indicates a row address fault, and a second value (e.g., "0") indicates no row address fault.

Similarly, with reference to FIG. 6B, ROM encoder 601' outputs a first output in response to its asserted row or rows, and ROM encoder 602' outputs a second output in response to its asserted row or rows. Comparator 603' compares the first output against a first portion of column address component 105, and comparator 604' compares the second output against a second portion of column address component 105. The results of comparator 603' and 604' undergo an OR function by OR gate 605' to generate flag 606'. A first value of flag 606' (e.g., "1") indicates a column address fault, and a second value (e.g., "0") indicates no column address fault.

The total amount of switches/transistors needed for each design is summarized in Table 3:

| Address Bits N (Rows) | Prior Art Memory System 200 | Hierarchical ROM Encoder System 411 (Two-Level) | Hierarchical ROM Encoder System 511 (Three-Level) |
| --- | --- | --- | --- |
| 4 (16 rows) | 64 | 68 | — |
| 5 (32 rows) | 160 | 144 | 152 |
| 6 (64 rows) | 384 | 304 | 308 |
| 7 (128 rows) | 896 | 624 | 624 |
| 8 (256 rows) | 2048 | 1280 | 1264 |
| 9 (512 rows) | 4608 | 2624 | 2544 |
| 10 (1024 rows) | 10240 | 5376 | 5104 |

Figure 7A:
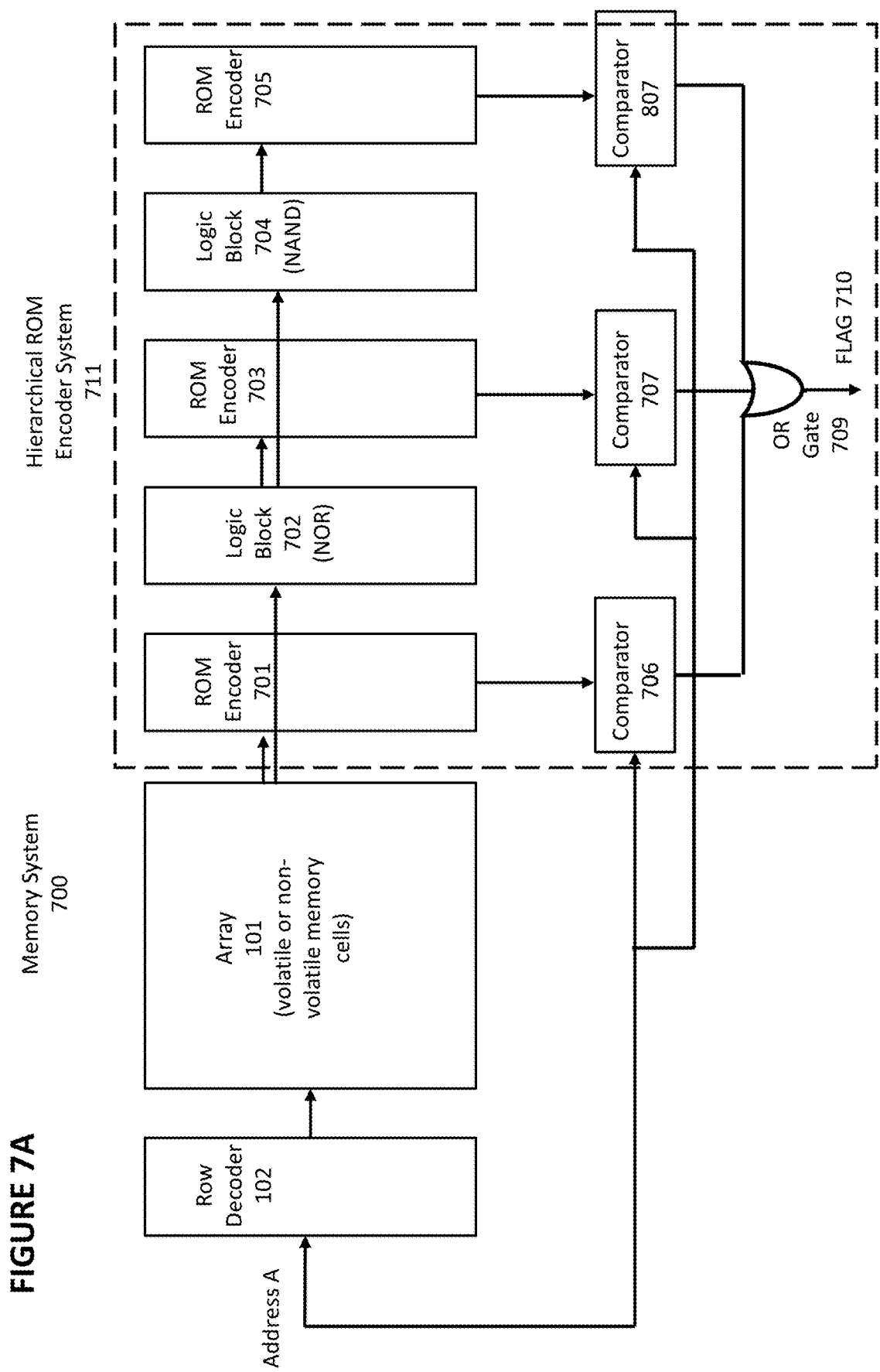
FIGS. 7A and 7B depict another embodiment of a memory system with an improved address fault detection system.
Figure 7B:
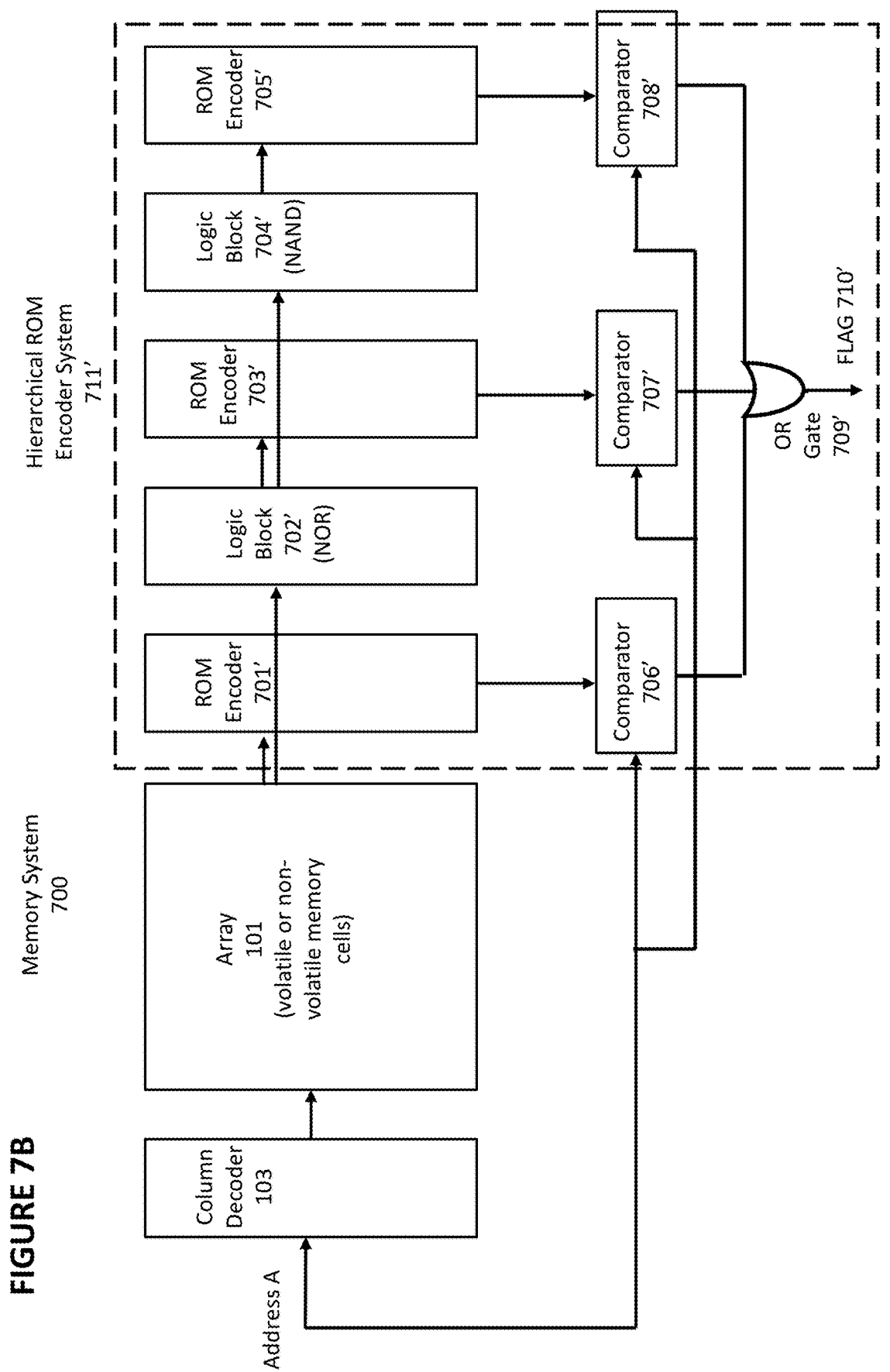

FIGS. 7A and 7B depict memory system 700.

In FIG. 7A, memory system 700 comprises array 101, row decoder 102, and hierarchical ROM encoder system 711. In FIG. 7B, memory system 700 comprises array 101 and further comprises column decoder 103 and hierarchical ROM encoder system 711'.

Hierarchical ROM encoder system 711 comprises ROM encoder 701, logic block 702 (comprising NOR gates), ROM encoder 703, logic block 704 (comprising NAND gates), ROM encoder 705, comparator 706, comparator 707, comparator 708, OR gate 709, and flag 710 (a row address fault detection signal). Similarly, hierarchical ROM encoder system 711' comprises ROM encoder 701', logic block 702' (comprising NOR gates), ROM encoder 703', logic block 704' (comprising NAND gates), ROM encoder 705', comparator 706', comparator 707', comparator 708', OR gate 709', and flag 710' (a column address fault detection signal).

Hierarchical ROM encoder systems 711 and 711' are similar to hierarchical ROM encoder systems 511 and 511' in FIGS. 5A and 5B, respectively, except that logic block 702 and logic block 702' comprise NOR gates, and logic blocks 704 and 704' comprise NAND gates, which can reduce number of switches required compared to using logic blocks 502 and 502' comprising OR gates and logic blocks 504 and 504' comprising OR gates, since NOR gates and NAND gates require fewer switches than OR gates. In FIGS. 7A and 7B, due to the change in logic blocks, the switches in ROM encoders 701 and 705 and 701' and 705' are formed of NMOS transistors, and the switches in ROM encoders 703 and 703' are formed of PMOS transistors so that the correct logic is performed in selecting the correct row in each encoder.

With reference to FIG. 7A, during operation, ROM encoder 701 outputs a first output in response to its asserted row or rows, ROM encoder 702 outputs a second output in response to its asserted row or rows, and ROM encoder 703 outputs a third output in response to its asserted row or rows. Comparator 706 compares the first output against a first portion of row address component 104, comparator 707 compares the second output against a second portion of row address component 104, and comparator 708 compares the third output against a third portion of row address component 104. The results of comparators 706, 707, and 708 undergo an OR function by OR gate 709 to generate flag 710, which is a row address fault detection signal. A first value of flag 710 (e.g., "1") indicates a row address fault, and a second value (e.g., "0") indicates no row address fault.

Similarly, with reference to FIG. 7B, during operation, ROM encoder 701' outputs a first output in response to its asserted row or rows, ROM encoder 702' outputs a second output in response to its asserted row or rows, and ROM encoder 703' outputs a third output in response to its asserted row or rows. Comparator 706' compares the first output against a first portion of column address component 105, comparator 707' compares the second output against a second portion of column address component 105, and comparator 708' compares the third output against a third portion of row address component 104 (or column address component 105). The results of comparators 706', 707', and 708' undergo an OR function by OR gate 709' to generate flag 710', which is a column address fault detection signal. A first value of flag 710' (e.g., "1") indicates a column address fault, and a second value (e.g., "0") indicates no column address fault.

A person of ordinary skill in the art will appreciate that a hierarchical ROM encoder system can be built with more than 3 levels (e.g., n levels) using the concepts described herein.

What is claimed is:

1. A memory system, comprising:
an array of memory cells arranged in rows and columns;
a row decoder for receiving a row address component and asserting one of a plurality of word lines, each word line coupled to a row in the array; and
a hierarchical ROM encoder system, comprising:
a first ROM encoder for receiving the plurality of word lines and generating a first output;
a logic block for receiving the plurality of word lines and generating a logic block output;
a second ROM encoder for receiving the logic block output and generating a second output;
a first comparator for comparing the first output and a first part of the row address component;
a second comparator for comparing the second output and a second part of the row address component; and
a gate for generating a row address fault detection signal based on an output from the first comparator and an output from the second comparator.

2. The memory system of claim 1, wherein the logic block comprises a plurality of OR gates.

3. The memory system of claim 1, wherein the memory cells comprise volatile memory cells.

4. The memory system of claim 1, wherein the memory cells comprise non-volatile memory cells.

5. A memory system, comprising:
an array of memory cells arranged in rows and columns;
a column decoder for receiving a column address component and generating a column selection in response to the column address component;
a hierarchical ROM encoder system, comprising:
a first ROM encoder for receiving the column selection and generating a first output;
a logic block for receiving the column selection and generating a logic block output;
a second ROM encoder for receiving the logic block output and generating a second output;
a first comparator for comparing the first output and a first part of the column address component;
a second comparator for comparing the second output and a second part of the column address component; and
a gate for generating a column address fault detection signal based on an output from the first comparator and an output from the second comparator.

6. The memory system of claim 5, wherein the logic block comprises a plurality of OR gates.

7. The memory system of claim 5, wherein the memory cells comprise volatile memory cells.

8. The memory system of claim 5, wherein the memory cells comprise non-volatile memory cells.

9. A memory system, comprising:
an array of memory cells arranged in rows and columns;
a row decoder for receiving a row address component and asserting one of a plurality of word lines, each word line coupled to a row in the array; and
a hierarchical ROM encoder system, comprising:
a first ROM encoder for receiving the plurality of word lines and generating a first output;
a first logic block for receiving the plurality of word lines and generating a first logic block output;
a second ROM encoder for receiving the first logic block output and generating a second output;
a second logic block for receiving the first logic block output and generating a second logic block output;
a third ROM encoder for receiving the second logic block output and generating a third output;
a first comparator for comparing the first output and a first part of the row address component;
a second comparator for comparing the second output and a second part of the row address component;
a third comparator for comparing the third output and a third part of the row address component;
a gate for generating a row address fault detection signal based on an output from the first comparator, an output from the second comparator, and an output from the third comparator.

10. The memory system of claim 9, wherein the first logic block comprises OR gates.

11. The memory system of claim 10, wherein the second logic block comprises OR gates.

12. The memory system of claim 9, wherein the first logic block comprises NOR gates.

13. The memory system of claim 12, wherein the second logic block comprises NAND gates.

14. The memory system of claim 9, wherein the memory cells comprise volatile memory cells.

15. The memory system of claim 9, wherein the memory cells comprise non-volatile memory cells.

16. A memory system, comprising:
   an array of memory cells arranged in rows and columns;
   a column decoder for receiving a column address component and asserting one of a plurality of bit lines, each bit line coupled to a column in the array; and
   a hierarchical ROM encoder system, comprising:
      a first ROM encoder for receiving the column address component and generating a first output;
      a first logic block for receiving the column address component and generating a first logic block output;
      a second ROM encoder for receiving the first logic block output and generating a second output;
      a second logic block for receiving the first logic block output and generating a second logic block output;
      a third ROM encoder for receiving the second logic block output and generating a third output;
      a first comparator for comparing the first output and a first part of the column address component;
      a second comparator for comparing the second output and a second part of the column address component;
      a third comparator for comparing the third output and a third part of the column address component; and
      a gate for generating a column address fault detection signal based on an output from the first comparator, an output from the second comparator, and an output from the third comparator.

17. The memory system of claim 16, wherein the first logic block comprises OR gates.

18. The memory system of claim 17, wherein the second logic block comprises OR gates.

19. The memory system of claim 16, wherein the first logic block comprises NOR gates.

20. The memory system of claim 19, wherein the second logic block comprises NAND gates.

21. The memory system of claim 16, wherein the memory cells comprise volatile memory cells.

22. The memory system of claim 16, wherein the memory cells comprise non-volatile memory cells.

* * * * *